(12) United States Patent
Takahata et al.

(10) Patent No.: US 12,443,080 B2
(45) Date of Patent: Oct. 14, 2025

(54) ACTIVE MATRIX SUBSTRATE AND DISPLAY DEVICE

(71) Applicant: Sharp Display Technology Corporation, Kameyama (JP)

(72) Inventors: Hitoshi Takahata, Kameyama (JP); Tohru Daitoh, Kameyama (JP); Tetsuo Kikuchi, Kameyama (JP); Masahiko Suzuki, Kameyama (JP); Setsuji Nishimiya, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 3 days.

(21) Appl. No.: 18/211,805

(22) Filed: Jun. 20, 2023

(65) Prior Publication Data
US 2023/0418123 A1 Dec. 28, 2023

(30) Foreign Application Priority Data

Jun. 22, 2022 (JP) .................................. 2022-100162

(51) Int. Cl.
| | | |
|---|---|---|
| G02F 1/1362 | (2006.01) | |
| G02F 1/1368 | (2006.01) | |
| H10D 86/40 | (2025.01) | |
| H10D 86/60 | (2025.01) | |

(52) U.S. Cl.
CPC ...... *G02F 1/136286* (2013.01); *G02F 1/1368* (2013.01); *H10D 86/423* (2025.01); *H10D 86/441* (2025.01); *H10D 86/60* (2025.01)

(58) Field of Classification Search
USPC ...................................... 349/139, 33, 42–43
See application file for complete search history.

(56) References Cited

U.S. PATENT DOCUMENTS

| | | | |
|---|---|---|---|
| 10,903,246 B2 * | 1/2021 | Lee | ..................... H01L 27/1225 |
| 11,257,886 B2 * | 2/2022 | Bae | ..................... H10K 59/131 |
| 11,493,811 B2 * | 11/2022 | Sugimoto | .......... G02F 1/136209 |
| 2008/0153039 A1 | 6/2008 | Akimoto | |
| 2009/0111244 A1 | 4/2009 | Yamazaki et al. | |
| 2012/0138922 A1 | 6/2012 | Yamazaki et al. | |

(Continued)

FOREIGN PATENT DOCUMENTS

| | | |
|---|---|---|
| CN | 101409221 A | 4/2009 |
| EP | 3 640 986 A1 | 4/2020 |

(Continued)

*Primary Examiner* — Dung T Nguyen
(74) *Attorney, Agent, or Firm* — Keating & Bennett, LLP

(57) ABSTRACT

An active matrix substrate includes a pixel TFT including an oxide semiconductor layer, a gate insulating layer provided on the oxide semiconductor layer, and a gate electrode disposed so as to face the oxide semiconductor layer with the gate insulating layer interposed therebetween, a plurality of gate lines, an interlayer insulating layer provided so as to cover the gate electrode and the plurality of gate lines, a plurality of source lines provided on the interlayer insulating layer, an upper insulating layer provided so as to cover the plurality of source lines, and an organic insulating layer provided on the upper insulating layer. The interlayer insulating layer includes a first layer formed of silicon oxide, a second layer provided on the first layer and formed of silicon nitride, and a third layer provided on the second layer and formed of silicon oxide.

14 Claims, 21 Drawing Sheets

(56) References Cited

U.S. PATENT DOCUMENTS

| | | | |
|---|---|---|---|
| 2012/0242923 A1* | 9/2012 | Miyamoto | G02F 1/136227 |
| | | | 349/43 |
| 2013/0320334 A1 | 12/2013 | Yamazaki et al. | |
| 2014/0286076 A1 | 9/2014 | Aoki et al. | |
| 2016/0306247 A1 | 10/2016 | Ito et al. | |
| 2016/0380115 A1 | 12/2016 | Nakano et al. | |
| 2018/0076241 A1* | 3/2018 | Takechi | H01L 27/124 |
| 2019/0243194 A1 | 8/2019 | Okada | |
| 2019/0391428 A1 | 12/2019 | Yagi et al. | |
| 2020/0089064 A1 | 3/2020 | Morinaga et al. | |
| 2020/0303425 A1 | 9/2020 | Hara et al. | |
| 2021/0273107 A1 | 9/2021 | Kikuchi et al. | |

FOREIGN PATENT DOCUMENTS

| | | |
|---|---|---|
| JP | 05-273589 A | 10/1993 |
| JP | 05-291165 A | 11/1993 |
| JP | 2008-114250 A | 5/2008 |
| JP | 2008-135717 A | 6/2008 |
| JP | 2008-177553 A | 7/2008 |
| JP | 2012-134475 A | 7/2012 |
| JP | 2012-178452 A | 9/2012 |
| JP | 2014-007399 A | 1/2014 |
| JP | 2014-209727 A | 11/2014 |
| JP | 2018-195610 A | 12/2018 |
| JP | 2020-076951 A | 5/2020 |
| JP | 2020-523767 A | 8/2020 |
| WO | 2015/083639 A1 | 6/2015 |
| WO | 2015/151337 A1 | 10/2015 |
| WO | 2018/043472 A1 | 3/2018 |
| WO | 2018/139450 A1 | 8/2018 |

* cited by examiner

ACTIVE MATRIX SUBSTRATE AND DISPLAY DEVICE

CROSS-REFERENCE TO RELATED APPLICATIONS

This application claims the benefit of priority to Japanese Patent Application Number 2022-100162 filed on Jun. 22, 2022. The entire contents of the above-identified application are hereby incorporated by reference.

BACKGROUND

Technical Field

The disclosure relates to an active matrix substrate and a display device.

Currently, a display device that is widely used includes an active matrix substrate provided with switching elements on a pixel-by-pixel basis. An active matrix substrate provided with thin film transistors (hereinafter referred to as a "TFT") as the switching elements is referred to as a TFT substrate. In the specification, a region of the TFT substrate corresponding to the pixel in the display device may be referred to as a "pixel region", and the TFT provided as the switching element in each pixel region of the active matrix substrate may be referred to as a "pixel TFT". A gate electrode, a gate line, and the like of the TFT may be collectively referred to as a "gate metal layer", and a source electrode, a drain electrode, a source line, and the like of the TFT may be collectively referred to as a "source metal layer".

In recent years, there is proposed use of an oxide semiconductor as a material of an active layer of the TFT, in place of amorphous silicon and polycrystalline silicon. A TFT having an oxide semiconductor film as an active layer is referred to as an "oxide semiconductor TFT". JP 2012-134475 A discloses an active matrix substrate in which an In—Ga—Zn—O-based semiconductor film is used in an active layer of a TFT.

The oxide semiconductor has mobility higher than that of amorphous silicon. Thus, the oxide semiconductor TFT can operate at a higher speed than an amorphous silicon TFT. In addition, since an oxide semiconductor film is formed by a process simpler than that of a polycrystalline silicon film, the oxide semiconductor film can be applied to a device that requires a large area.

A structure of the TFT is roughly classified into a bottom gate structure and a top gate structure. Currently, the bottom gate structure is often adopted for the oxide semiconductor TFT, but it is also proposed to use the top gate structure (see, for example, JP 2020-76951 A). In the top gate structure, the gate insulating layer can be thinned, resulting in high current supply performance.

SUMMARY

In an active matrix substrate including the oxide semiconductor TFT having the top gate structure, a layered structure including a silicon oxide ($SiO_2$) layer as a lower layer and a silicon nitride (SiN) layer as an upper layer may be employed for an interlayer insulating layer that covers the gate metal layer from the viewpoint of preventing the oxide semiconductor from having a depletion characteristic. A similar layered structure may also be employed for an upper insulating layer that covers the source metal layer.

In the active matrix substrate including the oxide semiconductor TFT having the top gate structure, an opening may be formed in both an organic insulating layer provided as a flattened layer on the upper insulating layer and the upper insulating layer. According to a study by the inventors of the disclosure, it is found that when such an opening is formed in the active matrix substrate in which the above-described layered structure is employed for the interlayer insulating layer and the upper insulating layer, a breakdown voltage between the gate metal layer and the source metal layer may be decreased in the region where the opening is formed, and a leakage current may be generated, and thus yield and reliability may be reduced.

An embodiment of the disclosure has been conceived in light of the above-described problem, and an object of the disclosure is to improve yield and reliability of the active matrix substrate including the oxide semiconductor TFT having the top gate structure.

The present specification discloses an active matrix substrate and a display device described in the following Items.

Item 1

Active matrix substrate including a plurality of pixel regions arranged in a matrix, a substrate, a pixel TFT supported by the substrate and provided corresponding to each of the plurality of pixel regions, the pixel TFT including an oxide semiconductor layer, a gate insulating layer provided on the oxide semiconductor layer, and a gate electrode facing the oxide semiconductor layer with the gate insulating layer interposed therebetween, a plurality of gate lines extending in a row direction and formed of the same conductive film as the gate electrode, an interlayer insulating layer covering the gate electrode and the plurality of gate lines, a plurality of source lines extending in a column direction and provided on the interlayer insulating layer, an upper insulating layer covering the plurality of source lines, and an organic insulating layer provided on the upper insulating layer, wherein the interlayer insulating layer includes a first layer formed of silicon oxide, a second layer provided on the first layer and formed of silicon nitride, and a third layer provided on the second layer and formed of silicon oxide.

Item 2

The active matrix substrate according to item 1, wherein a thickness of the third layer of the interlayer insulating layer is 50 nm or more.

Item 3

The active matrix substrate according to item 1 or 2, wherein the upper insulating layer includes a fourth layer formed of silicon oxide and a fifth layer provided on the fourth layer and formed of silicon nitride.

Item 4

The active matrix substrate according to item 1 or 2, wherein the upper insulating layer includes a fourth layer formed of silicon nitride, a fifth layer provided on the fourth layer and formed of silicon oxide, and a sixth layer provided on the fifth layer and formed of silicon nitride.

Item 5

The active matrix substrate according to item 1 or 2, wherein the upper insulating layer includes only a fourth layer formed of silicon nitride.

Item 6

The active matrix substrate according to any one of items 1 to 5, further including a gate metal layer including the gate electrode and the plurality of gate lines and a source metal layer including the plurality of source lines, wherein when a region in which the gate metal layer and the source metal layer overlap each other with the interlayer insulating layer interposed therebetween is referred to as an intersection region, the organic insulating layer and the upper insulating layer include an opening formed over both the organic insulating layer and the upper insulating layer and overlapping the intersection region.

Item 7

The active matrix substrate according to item 6, wherein the interlayer insulating layer includes a portion including the first layer and the second layer and not including the third layer in a region overlapping the opening.

Item 8

The active matrix substrate according to item 7, wherein a thickness of the second layer included in the portion of the interlayer insulating layer is 50 nm or more.

Item 9

The active matrix substrate according to item 6, wherein the interlayer insulating layer includes the first layer, the second layer, and the third layer in the entirety of the region overlapping the opening.

Item 10

The active matrix substrate according to any one of items 6 to 9, further including a gate line drive circuit that drives the plurality of gate lines, the gate line drive circuit being monolithically formed on the substrate, wherein the opening included in the organic insulating layer and the upper insulating layer is located in the gate line drive circuit.

Item 11

The active matrix substrate according to any one of items 1 to 10, wherein the oxide semiconductor layer includes an In—Ga—Zn—O based semiconductor.

Item 12

The active matrix substrate according to item 11, wherein the In—Ga—Zn—O based semiconductor includes a crystalline portion.

Item 13

A display device including the active matrix substrate according to any one of items 1 to 12.

Item 14

The display device according to item 13, wherein the display device is a liquid crystal display device including a counter substrate facing the active matrix substrate, and a liquid crystal layer provided between the active matrix substrate and the counter substrate.

According to an embodiment of the disclosure, yield and reliability of an active matrix substrate including the oxide semiconductor TFT having the top gate structure can be improved.

BRIEF DESCRIPTION OF DRAWINGS

The disclosure will be described with reference to the accompanying drawings, wherein like numbers reference like elements.

DESCRIPTION OF EMBODIMENTS

Hereinafter, embodiments of the disclosure will be described with reference to the accompanying drawings. Note that the embodiments of the disclosure are not limited to those illustrated below.

First Embodiment

Figure 1:
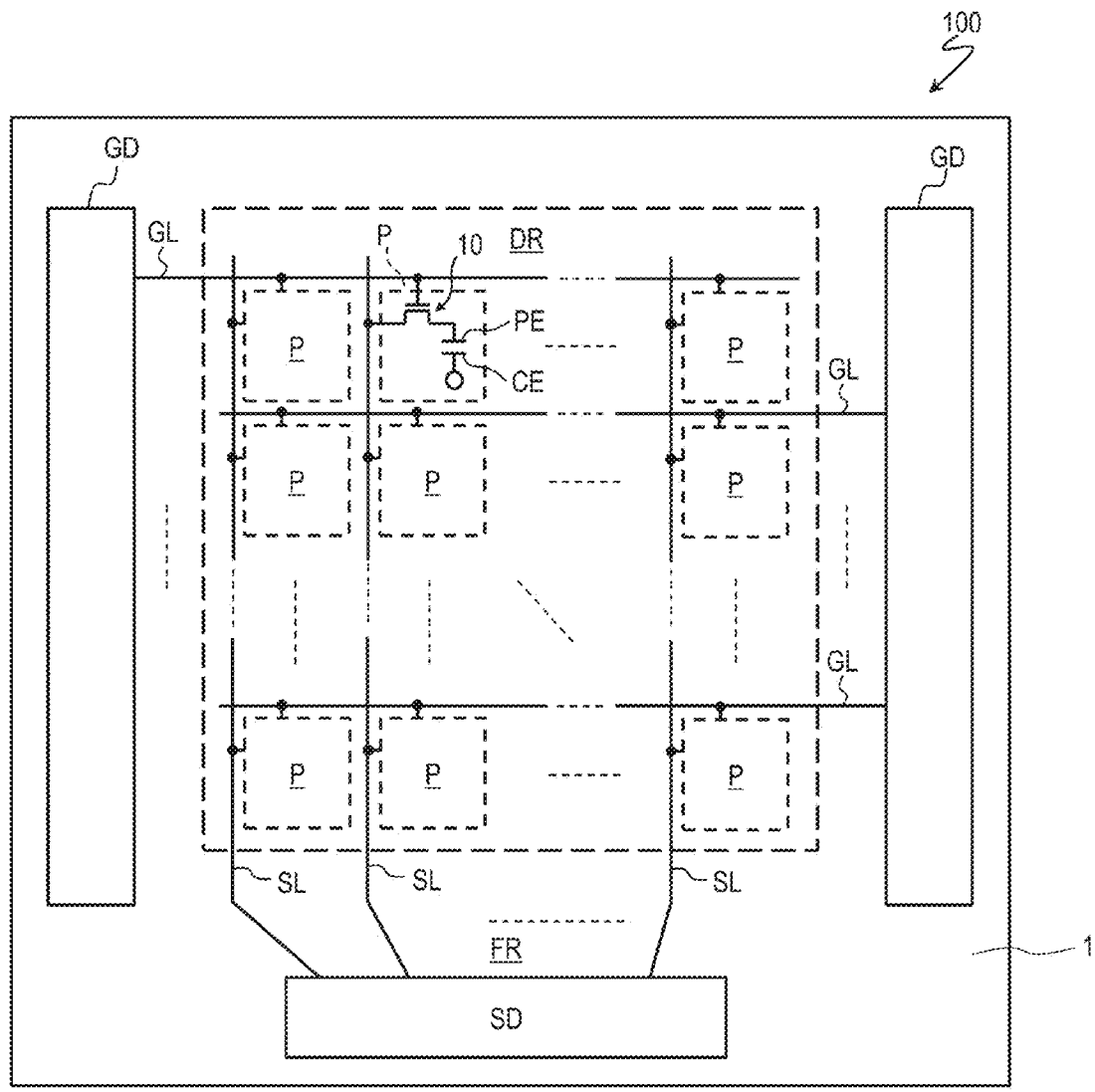
FIG. 1 is a plan view schematically illustrating an active matrix substrate 100 according to an embodiment of the disclosure.

First, an overview of a structure of an active matrix substrate 100 according to the present embodiment will be described with reference to FIG. 1. FIG. 1 is a schematic view illustrating an example of a planar structure of the active matrix substrate 100.

The active matrix substrate 100 includes a display region DR and a peripheral region (also referred to as a "frame region") FR as illustrated in FIG. 1. The display region DR includes a plurality of pixel regions P arranged in a matrix shape. The pixel regions P (also simply referred to as "pixels") are regions corresponding to pixels of the display device. The peripheral region FR is located around the display region DR.

In the display region DR, a plurality of gate lines GL extending in a row direction, and a plurality of source lines SL extending in a column direction intersecting (typically orthogonal to) the row direction are formed. Each of the pixel regions P is, for example, a region surrounded by two gate lines GL adjacent to each other and two source lines SL adjacent to each other.

The active matrix substrate 100 includes a substrate 1 and a pixel TFT 10 supported by the substrate 1 and provided corresponding to each pixel region P. The pixel TFT 10 is an oxide semiconductor TFT including an oxide semiconductor layer as an active layer.

Each pixel region P includes a pixel electrode PE in addition to the above-described pixel TFT 10. A gate electrode of the pixel TFT 10 is electrically connected to a corresponding gate line GL. A source electrode of the pixel TFT 10 is electrically connected to the corresponding source line SL. A drain electrode of the pixel TFT 10 is electrically connected to the pixel electrode PE. When the active matrix substrate 100 is applied to a liquid crystal display device of a transverse electrical field mode such as a Fringe Field Switching (FFS) mode, an electrode (common electrode) CE that is common to the plurality of pixels is provided in the active matrix substrate 100.

A gate driver (gate line drive circuit) GD that drives the gate line GL, and a source driver (source line drive circuit) SD that drives the source line SL are disposed in the peripheral region FR. Here, the gate driver GD is integrally (monolithically) formed on the substrate 1, and the source driver SD is mounted on the substrate 1. Although not illustrated, a Source Shared driving (SSD) circuit (also referred to as a "demultiplexer circuit") and the like may be further disposed in the peripheral region FR.

Figure 2:
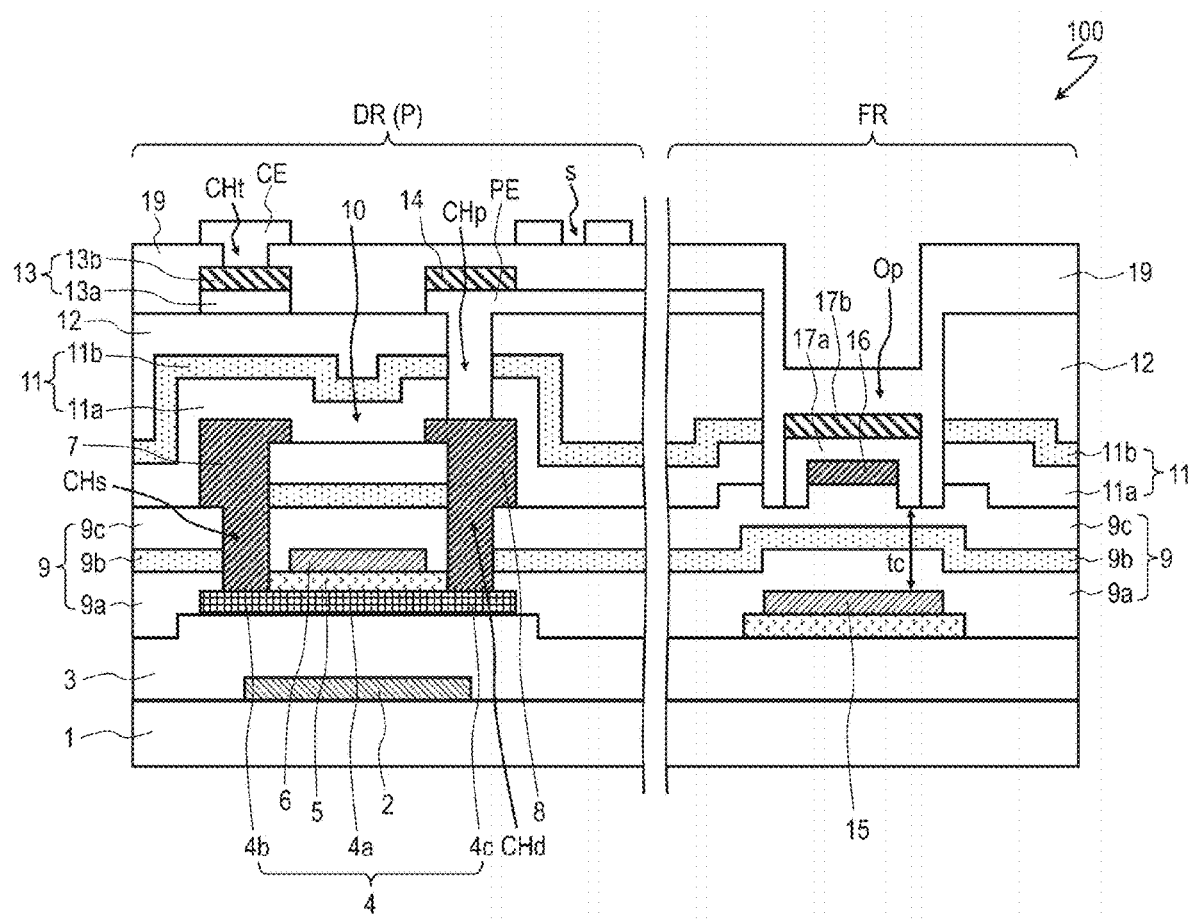
FIG. 2 is a cross-sectional view schematically illustrating the active matrix substrate 100.

Next, a more specific structure of the active matrix substrate 100 will be described with reference to FIG. 2. FIG. 2 is a cross-sectional view schematically illustrating the active matrix substrate 100. A part of the pixel region P of the display region DR is illustrated on the left side in FIG. 2, and a part of the peripheral region FR is illustrated on the right side in FIG. 2. The active matrix substrate 100 exemplified in FIG. 2 is used for an in-cell touch panel liquid crystal display device that performs display in an FFS mode.

First, a structure of the pixel region P will be described. On the left side in FIG. 2, the vicinity of the pixel TFT 10 in the pixel region P is illustrated. As illustrated in FIG. 2, the pixel region P includes a light blocking layer 2, the pixel TFT (oxide semiconductor TFT) 10, the pixel electrode PE, and a common electrode CE.

The light blocking layer 2 is provided on the substrate 1. A lower insulating layer 3 is provided so as to cover the light blocking layer 2. The pixel TFT 10 is formed on the lower insulating layer 3.

The pixel TFT 10 includes an oxide semiconductor layer 4, a gate insulating layer 5, a gate electrode 6, a source electrode 7, and a drain electrode 8. the pixel TFT 10 has the top gate structure.

The oxide semiconductor layer 4 has an island shape and is provided on the lower insulating layer 3. The oxide semiconductor layer 4 includes a channel region 4a, a source contact region 4b, and a drain contact region 4c. When viewed in a normal direction of the substrate plane, the channel region 4a overlaps the light blocking layer 2. That is, the channel region 4a is blocked from light by the light blocking layer 2. Each of the source contact region 4b and the drain contact region 4c is located on a respective one of both sides of the channel region 4a.

The gate insulating layer 5 is disposed on the channel region 4a of the oxide semiconductor layer 4. The gate electrode 6 is provided on the gate insulating layer 5. The gate electrode 6 is disposed so as to face the oxide semiconductor layer 4 (more specifically, the channel region 4a) with the gate insulating layer 5 interposed therebetween. The gate electrode 6 and the gate line GL are formed of the same conductive film (gate metal film). An interlayer insulating layer 9 is provided so as to cover the gate electrode 6 and the gate line GL.

The interlayer insulating layer 9 has a layered structure. Specifically, the interlayer insulating layer 9 includes a lower layer (first layer) 9a, an intermediate layer (second layer) 9b provided on the lower layer 9a, and an upper layer (third layer) 9c provided on the intermediate layer 9b. The lower layer 9a is formed of silicon oxide ($SiO_2$). The intermediate layer 9b is formed of silicon nitride (SiNx). The upper layer 9c is formed of silicon oxide ($SiO_2$).

The source electrode 7 and the drain electrode 8 are provided on the interlayer insulating layer 9. The source electrode 7 is connected to the source contact region 4b in a source contact hole CHs formed in the interlayer insulating layer 9. The drain electrode 8 is connected to the drain contact region 4c in a drain contact hole CHd formed in the interlayer insulating layer 9. The source electrode 7, the drain electrode 8, and the source line SL are formed of the same conductive film (source metal film). That is, the source line SL is also provided on the interlayer insulating layer 9.

An upper insulating layer (passivation layer) 11 is formed so as to cover the source electrode 7, the drain electrode 8, and the source line SL. The upper insulating layer 11 has a layered structure. Specifically, the upper insulating layer 11 includes a lower layer (fourth layer) 11a and an upper layer (fifth layer) 11b provided on the lower layer 11a. The lower layer 11a is formed of silicon oxide ($SiO_2$). The upper layer 11b is formed of silicon nitride (SiNx).

An organic insulating layer (flattened layer) 12 is provided on the upper insulating layer 11. The organic insulating layer 12 is formed of, for example, a photosensitive resin material.

The pixel electrode PE is provided on the organic insulating layer 12. The pixel electrode PE is formed of a transparent conductive material (e.g., ITO or IZO). The pixel electrode PE is disposed in each pixel region P and is electrically connected to the pixel TFT 10. More specifically, the pixel electrode PE is electrically connected to the drain electrode 8 of the pixel TFT 10. Here, the pixel electrode PE is connected to the drain electrode 8 in a pixel contact hole CHp formed in the organic insulating layer 12 and the upper insulating layer 11. A dielectric layer 19 is provided so as to cover the pixel electrode PE.

The common electrode CE is provided on the dielectric layer 19. The common electrode CE is formed of a transparent conductive material (e.g., ITO or IZO). At least one slit s is formed in the common electrode CE for each pixel region P. The common electrode CE is separated into a plurality of segments, and each segment functions as an electrode for a touch sensor (hereinafter referred to as a "touch sensor electrode").

Each touch sensor electrode (a segment of the common electrode CE) is electrically connected to a line for the touch sensor (hereinafter referred to as a "touch line") 13. The touch line 13 is formed on the organic insulating layer 12. Specifically, each touch sensor electrode is electrically connected to the touch line 13 in a touch contact hole CHt formed in the dielectric layer 19. In the illustrated example, the touch line 13 has a layered structure including a lower line layer 13a and an upper line layer 13b located on the lower line layer 13a. The lower line layer 13a is formed of the same transparent conductive film as the pixel electrode PE. The upper line layer 13b is formed of a metal material. In the illustrated example, a protective electrode layer 14 is provided on the pixel electrode PE so as to overlap the pixel contact hole CHp. The protective electrode layer 14 is formed of the same metal film as the upper line layer 13b of the touch line 13.

Next, a structure of the peripheral region FR will be described. On the right side in FIG. 2, a region corresponding to a part of the gate line drive circuit GD formed in the peripheral region FR is illustrated. More specifically, the right side in FIG. 2 illustrates the vicinity of a region (hereinafter referred to as an "intersection region") where a lower line 15 included in the gate metal layer (that is, formed of the same conductive film as the gate electrode 6 or the like) and an upper line 16 included in the source metal layer (that is, formed of the same conductive film as the source electrode 7 or the like) overlap each other with the interlayer insulating layer 9 interposed therebetween.

An opening Op is formed over both the organic insulating layer 12 and the upper insulating layer 11 so as to overlap the intersection region. In the opening Op, the upper line 16 is covered with cover layers 17a and 17b. The cover layer 17a is formed of the same transparent conductive film as the pixel electrode PE. The cover layer 17b provided on the cover layer 17a is formed of the same metal film as the upper line layer 13b of the touch line 13.

A TFT (referred to as a "circuit TFT") constituting a monolithically formed peripheral circuit such as the gate line drive circuit GD may be an oxide semiconductor TFT similarly to the pixel TFT 10.

Figure 3A:
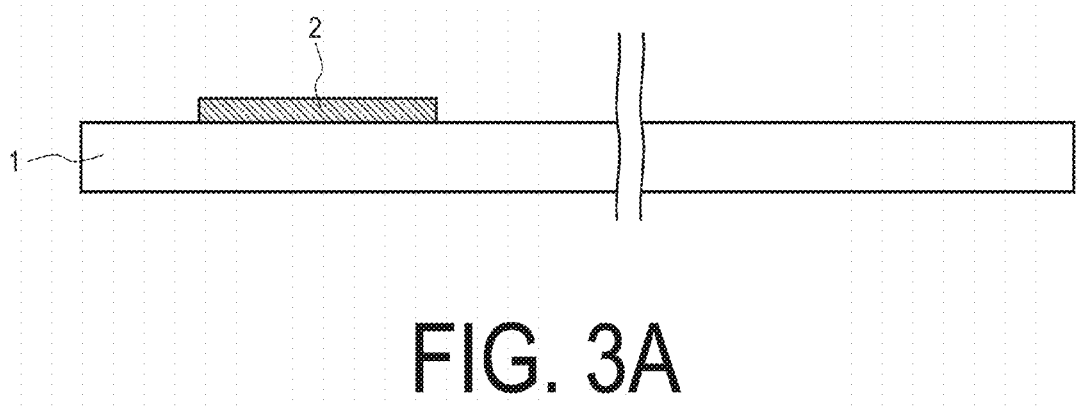
FIG. 3A is a process cross-sectional view illustrating a manufacturing process for the active matrix substrate 100.

Next, a manufacturing method of the active matrix substrate 100 will be described with reference to FIG. 3A to FIG. 3N. FIG. 3A to FIG. 3N are process cross-sectional views for explaining the manufacturing method of the active matrix substrate 100.

First, as illustrated in FIG. 3A, the light blocking layer 2 is formed on the substrate 1. Specifically, the light blocking layer 2 can be formed by forming a conductive film (having a thickness of, for example, 50 nm or more and 500 nm or less) for the light blocking layer on the substrate 1 with an insulation property by a sputtering method or the like, and then patterning the light blocking layer conductive film.

For example, a glass substrate, a silicon substrate, a plastic substrate (resin substrate) having heat resistance, or the like can be used as the substrate 1.

As the conductive film for the light blocking layer, for example, a metal film including an element selected from aluminum (Al), chromium (Cr), copper (Cu), tantalum (Ta), titanium (Ti), molybdenum (Mo), or tungsten (W), or an alloy film including these elements as components can be used. A layered film including a plurality of films of these films may be used. For example, a layered film having a triple-layer structure of titanium film-aluminum film-titanium film, or a triple-layer structure of molybdenum film-aluminum film-molybdenum film can be used. Note that the conductive film for the light blocking layer is not limited to the triple-layer structure, and may have a single-layer, a dual-layer structure, or a layered structure of four or more layers. Here, as the conductive film for the light blocking layer, a layered film having a Ti film (having a thickness from 15 nm to 70 nm) as a lower layer and a Cu film (having a thickness from 200 nm to 400 nm) as an upper layer is used.

Figure 3B:
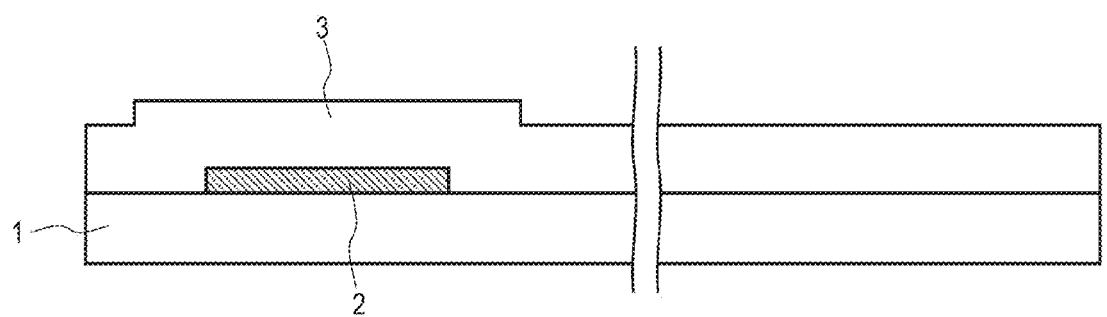
FIG. 3B is a process cross-sectional view illustrating a manufacturing process for the active matrix substrate 100.

Next, as illustrated in FIG. 3B, the lower insulating layer 3 (having a thickness of, for example, 200 nm or more and 500 nm or less) is formed so as to cover the light blocking layer 2.

Examples of the lower insulating layer 3 appropriately include a silicon oxide ($SiO_2$) layer, a silicon nitride (SiNx) layer, a silicon oxynitride (SiOxNy; x>y) layer, a silicon nitride oxide (SiNxOy; x>y) layer, an aluminum oxide layer, or a tantalum oxide layer. The lower insulating layer 3 may have a layered structure. Here, for example, the lower insulating layer 3 having a structure forming a layered film having a lower layer of a silicon nitride (SiNx) layer (having a thickness from 100 nm to 500 nm) and an upper layer of a silicon oxide ($SiO_2$) layer (having a thickness from 20 nm to 300 nm) is formed by CVD.

Figure 3C:
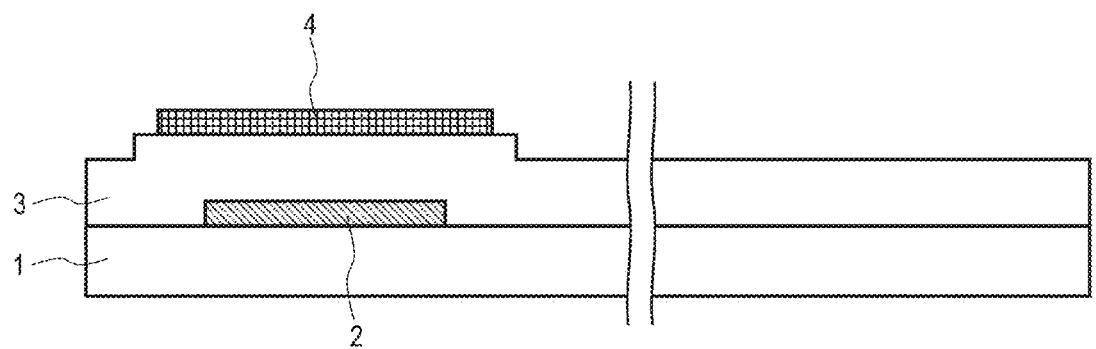
FIG. 3C is a process cross-sectional view illustrating a manufacturing process for the active matrix substrate 100.

Subsequently, as illustrated in FIG. 3C, the oxide semiconductor layer 4 is formed on the lower insulating layer 3. Specifically, the oxide semiconductor layer 4 can be formed by depositing an oxide semiconductor film (having a thickness of, for example, 15 nm or more and 200 nm or less) on the lower insulating layer 3 by, for example, a sputtering method and then patterning the oxide semiconductor film. The oxide semiconductor film may be patterned by wet etching. The oxide semiconductor film is not particularly limited and is, for example, an In—Ga—Zn—O based semiconductor film.

Figure 3D:
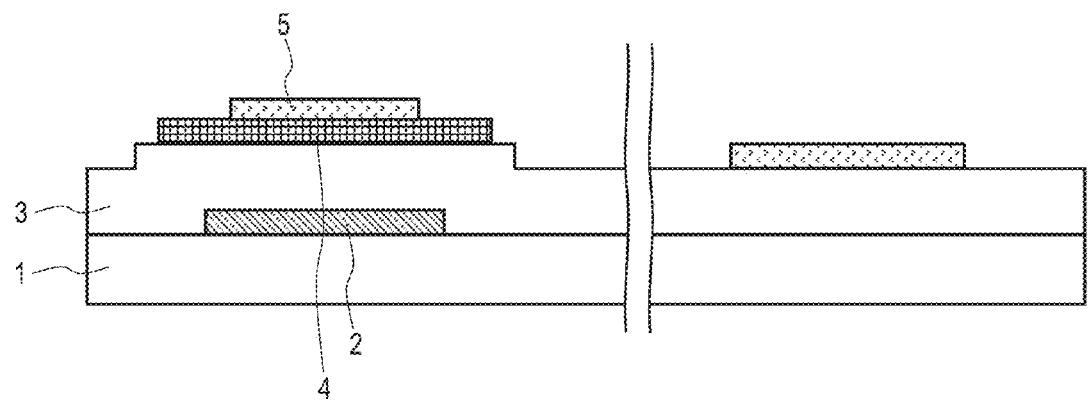
FIG. 3D is a process cross-sectional view illustrating a manufacturing process for the active matrix substrate 100.

Thereafter, as illustrated in FIG. 3D, the gate insulating layer 5 is formed on the oxide semiconductor layer 4. Specifically, the gate insulating layer 5 can be formed by depositing an insulating film (having a thickness of, for example, 80 nm or more and 250 nm or less) so as to cover the oxide semiconductor layer 4 by, for example, CVD, and then patterning the insulating film. The insulating film can be patterned, for example, by dry etching. As an insulating film for forming the gate insulating layer 5, an insulating film similar to the lower insulating layer 3 (insulating film exemplified as the lower insulating layer 3) can be used. Here, a silicon oxide ($SiO_2$) film is used as the insulating film.

Figure 3E:
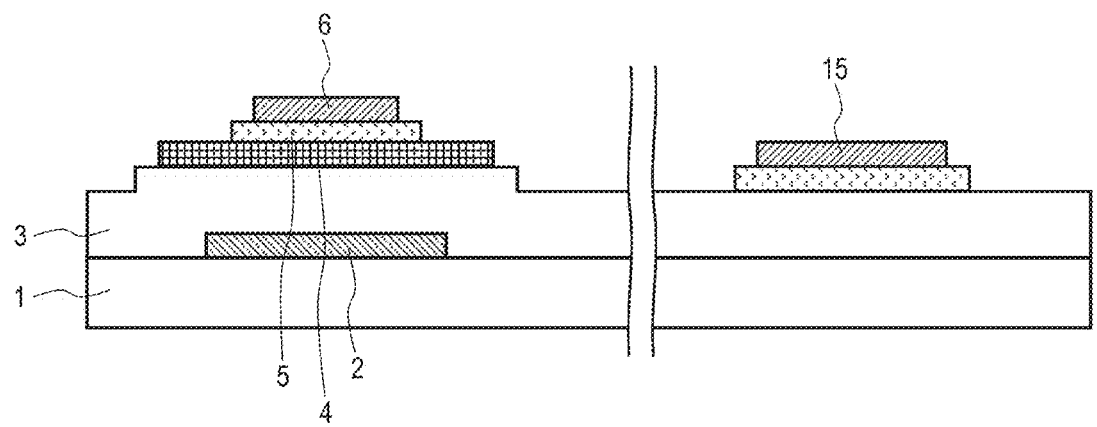
FIG. 3E is a process cross-sectional view illustrating a manufacturing process for the active matrix substrate 100.

Next, as illustrated in FIG. 3E, the gate electrode 6 is formed on the gate insulating layer 5. Specifically, the gate electrode 6 can be formed by depositing a gate conductive film (having a thickness of, for example, 50 nm or more and 500 nm or less) on the gate insulating layer 5 by, for example, a sputtering method, and then patterning the gate conductive film. At this time, the gate line GL and the lower line 15 are also formed. The gate conductive film can be patterned, for example, by wet etching or dry etching.

A conductive film similar to the conductive film for the light blocking layer can be used as the gate conductive film. Here, as the gate conductive film, a layered film having a Ti film (having a thickness from 15 nm to 70 nm) as a lower layer and a Cu film (having a thickness from 200 nm to 400 nm) as an upper layer is used.

Subsequently, resistance reduction processing for the oxide semiconductor layer 4 is performed using the gate electrode 6 as a mask. The resistance reduction processing is, for example, plasma processing. As a result, regions of the oxide semiconductor layer 4 not overlapping the gate electrode 6 and the gate insulating layer 5 are low resistance regions (the source contact region 4b and the drain contact region 4c) having a lower specific resistance than a region (the channel region 4a) overlapping the gate electrode 6 and the gate insulating layer 5.

Figure 3F:
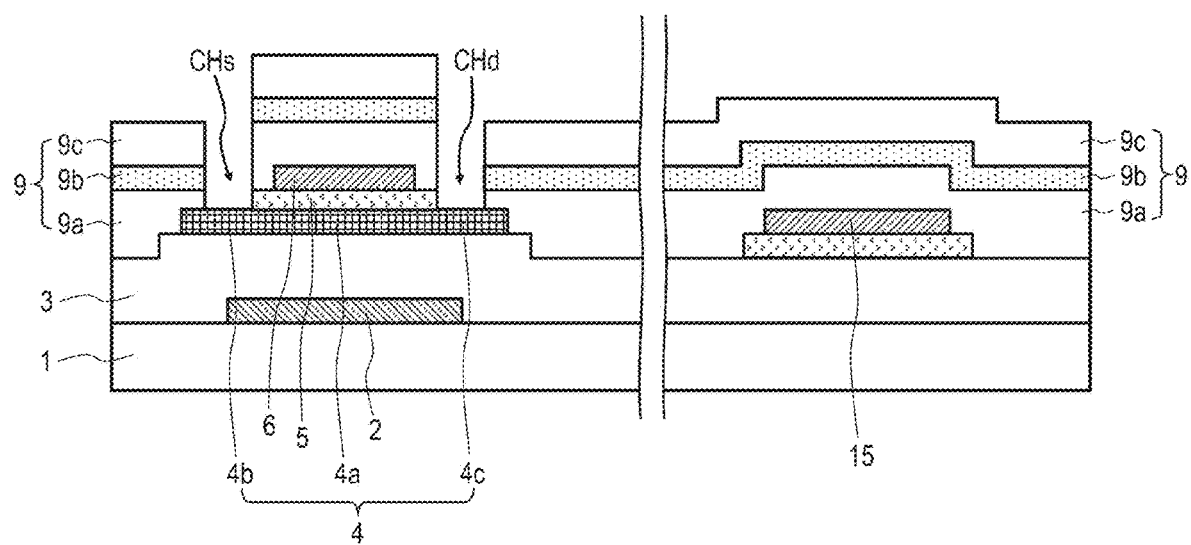
FIG. 3F is a process cross-sectional view illustrating a manufacturing process for the active matrix substrate 100.

Next, as illustrated in FIG. 3F, the interlayer insulating layer 9 is formed so as to cover the gate electrode 6, the lower line 15, and the like. A thickness of the entirety of the interlayer insulating layer 9 is, for example, 200 nm or more and 600 nm or less. A thickness of the lower layer 9a formed of silicon oxide is, for example, 200 nm or more and 400 nm or less. A thickness of the intermediate layer 9b formed of silicon nitride is, for example, 50 nm or more and 200 nm or less. A thickness of the upper layer 9c formed of silicon oxide is, for example, 50 nm or more and 200 nm or less. Here, for example, the lower layer 9a having a thickness of 300 nm, the intermediate layer 9b having a thickness of 120 nm, and the upper layer 9c having a thickness of 100 nm are sequentially formed by CVD.

Thereafter, in the interlayer insulating layer 9, the source contact hole CHs and the drain contact hole CHd are formed such that at least a part of the source contact region 4b and a part of the drain contact region 4c of the oxide semiconductor layer 4 are exposed. The source contact hole CHs and the drain contact hole CHd can be formed by, for example, a photolithography process including a dry etching process.

Figure 3G:
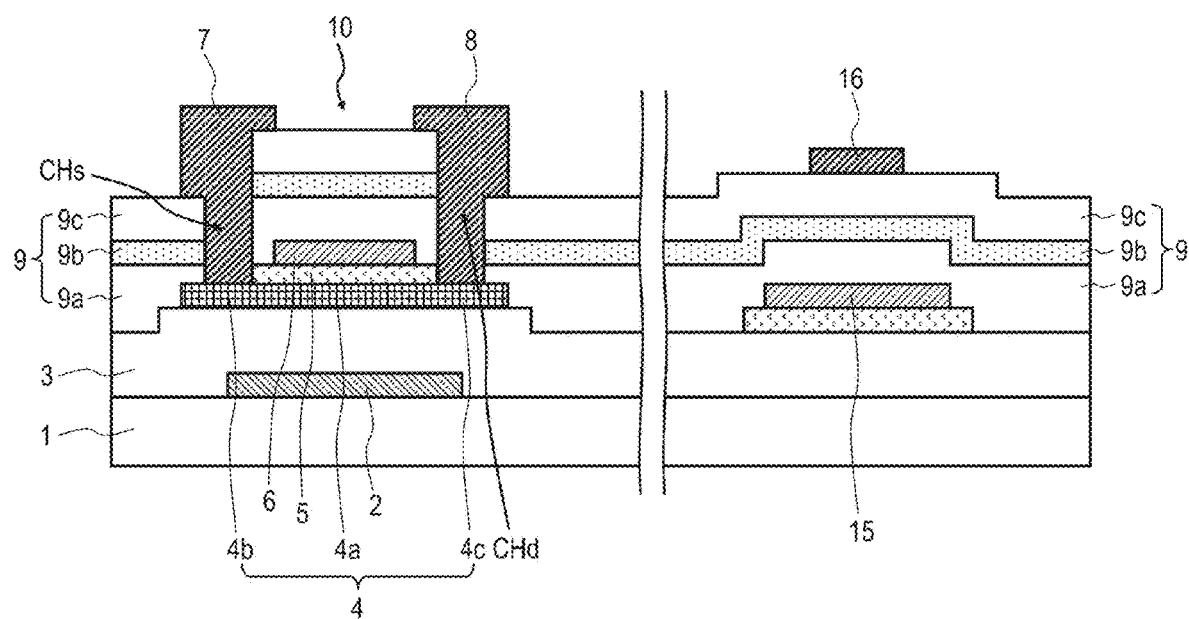
FIG. 3G is a process cross-sectional view illustrating a manufacturing process for the active matrix substrate 100.

Subsequently, as illustrated in FIG. 3G, the source electrode 7 and the drain electrode 8 are formed on the interlayer insulating layer 9. Specifically, the source electrode 7 and the drain electrode 8 can be formed by forming a source conductive film (having a thickness of, for example, 50 nm or more and 500 nm or less) in the source contact hole CHs and the drain contact hole CHd on the interlayer insulating layer 9, and then patterning the source conductive film. At this time, the source line SL and the upper line 16 are also formed. The patterning of the source conductive film can be performed, for example, by dry etching or wet etching.

As the source conductive film, an element selected from aluminum (Al), chromium (Cr), copper (Cu), tantalum (Ta), titanium (Ti), molybdenum (Mo), and tungsten (W), or an alloy including these elements as components can be used, for example. For example, the source conductive film may have a triple-layer structure of titanium film-aluminum film-titanium film, or a triple-layer structure of molybdenum film-aluminum film-molybdenum film. Note that the source conductive film is not limited to the triple-layer structure, and may have a single-layer structure or a dual-layer structure, or a layered structure of four or more layers. Here, a layered film having a Ti film (having a thickness from 15 to 70 nm) as a lower layer and a Cu film (having a thickness from 200 to 400 nm) as an upper layer is used.

Figure 3H:
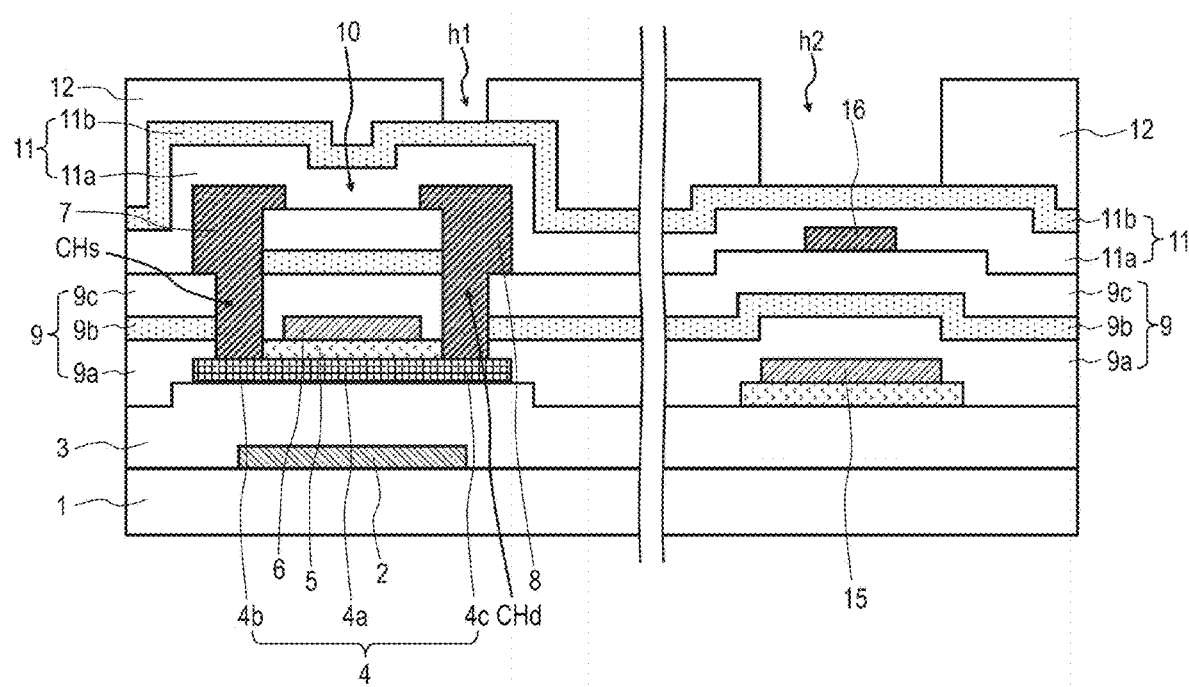
FIG. 3H is a process cross-sectional view illustrating a manufacturing process for the active matrix substrate 100.

Thereafter, as illustrated in FIG. 3H, the upper insulating layer 11 and the organic insulating layer 12 are sequentially formed so as to cover the pixel TFT 10. A thickness of the entirety of the upper insulating layer 11 is, for example, 100 nm or more and 400 nm or less. A thickness of the lower layer 11a formed of silicon oxide is, for example, 50 nm or more and 200 nm or less. A thickness of the upper layer 11b formed of silicon nitride is, for example, 25 nm or more and 200 nm or less. Here, for example, the lower layer 11a having a thickness of 75 nm and the upper layer 11b having a thickness of 50 nm are sequentially formed by CVD.

A thickness of the organic insulating layer 12 is, for example, from 1 μm to 3 μm, and preferably from 2 μm to 3 μm. The organic insulating layer 12 can be formed by, for example, applying a photosensitive resin material on the upper insulating layer 11, and then exposing and developing the photosensitive resin material. At the time of developing, a part of the photosensitive resin material is removed, and a first hole h1 and the second hole h2 are formed in the organic insulating layer 12. The first hole h1 is a part of the pixel contact hole CHp. The second hole h2 is a part of the opening Op overlapping the intersection region of the peripheral region FR.

Figure 3I:
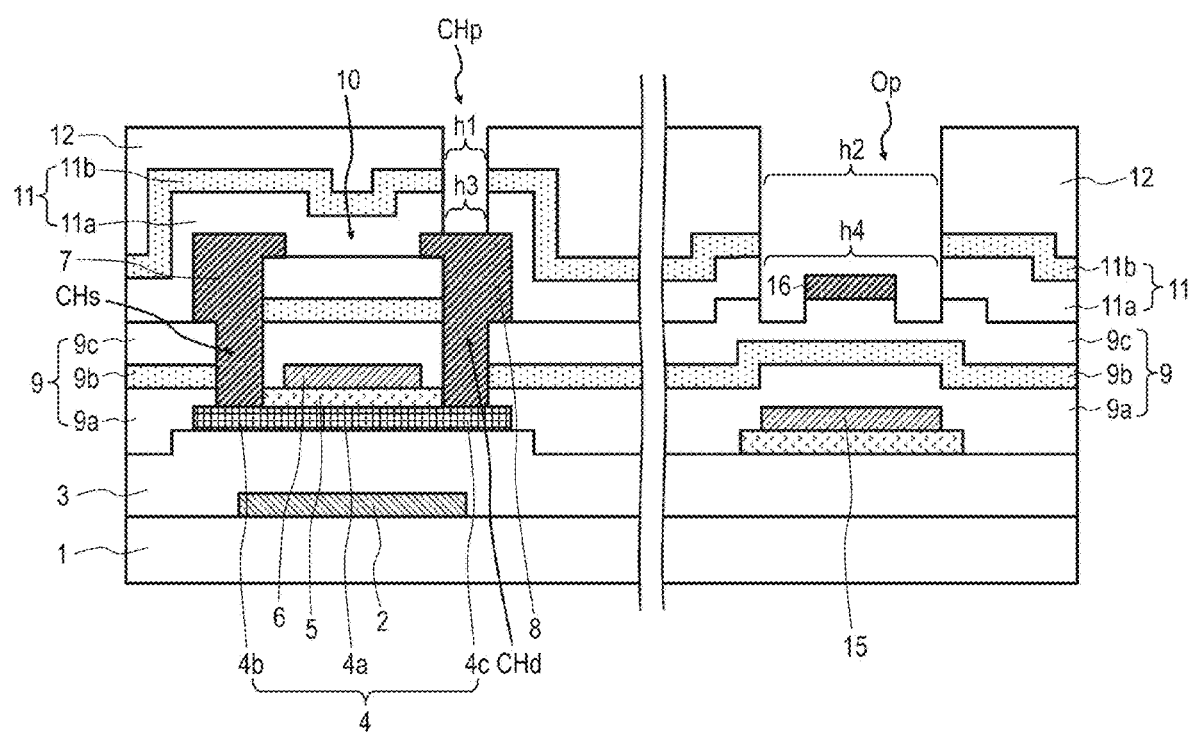
FIG. 3I is a process cross-sectional view illustrating a manufacturing process for the active matrix substrate 100.

Next, as illustrated in FIG. 3I, a third hole h3 and a fourth hole h4 continuous from the first hole h1 and the second hole h2, respectively, of the organic insulating layer 12 are formed in the upper insulating layer 11. Specifically, the third hole h3 and the fourth hole h4 can be formed in the upper insulating layer 11 by performing dry etching using the organic insulating layer 12 as a mask, and the pixel contact hole CHp and the opening Op overlapping the intersection region are completed. A gas such as a fluorine gas can be used for the dry etching.

Figure 3J:
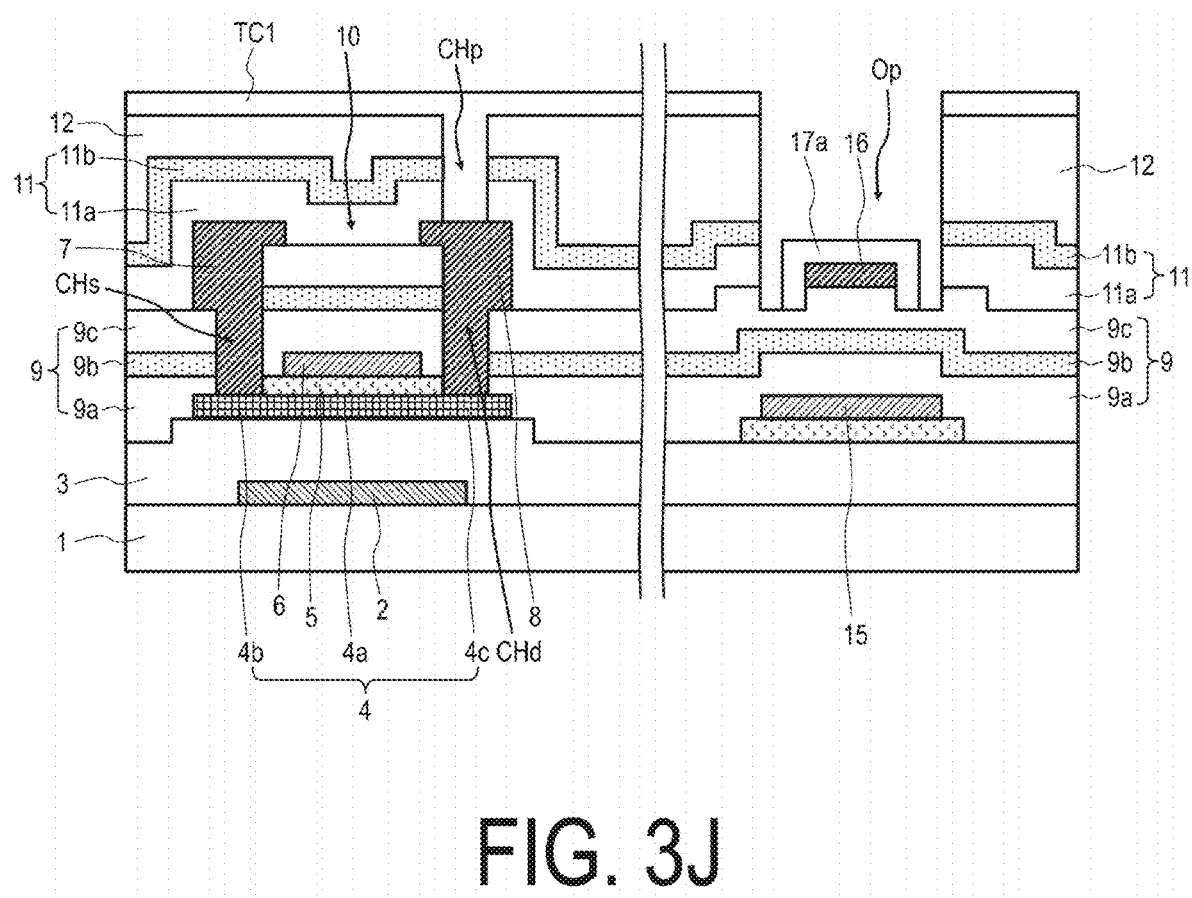
FIG. 3J is a process cross-sectional view illustrating a manufacturing process for the active matrix substrate 100.

Subsequently, the pixel electrode PE and the touch line 13 are formed on the organic insulating layer 12. Specifically, as illustrated in FIG. 3J, first, a first transparent conductive film TC1 (having a thickness of, for example, 20 nm or more and 300 nm or less) is formed on the organic insulating layer 12 and in the opening Op. Here, an indium tin oxide film (ITO) is formed as the first transparent conductive film TC1 by, for example, a sputtering method. An indium zinc oxide (IZO) film or the like may be used as the first transparent conductive film TC1. A part of the first transparent conductive film TC1 formed in the opening Op is the cover layer 17a.

Figure 3K:
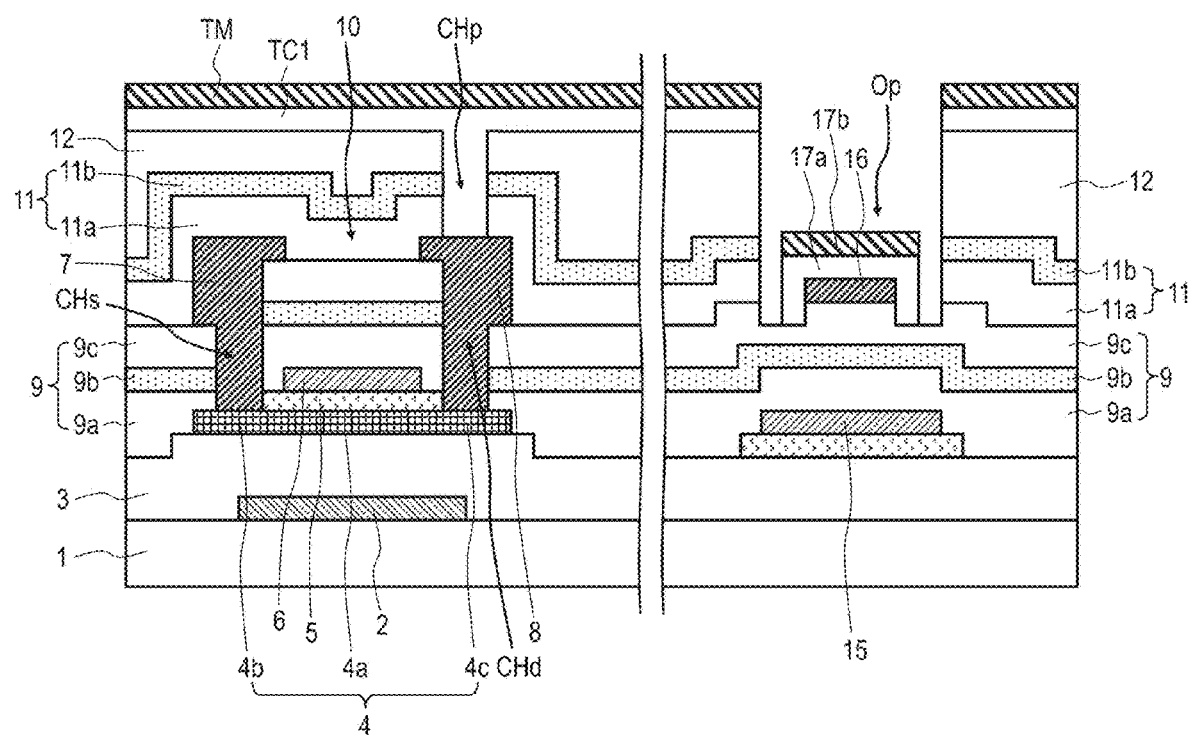
FIG. 3K is a process cross-sectional view illustrating a manufacturing process for the active matrix substrate 100.

Next, as illustrated in FIG. 3K, a touch line metal film TM is formed on the first transparent conductive film TC1. Here, as the touch line metal film TM, a Cu film (having a thickness of 100 nm or more and 500 nm or less) is formed by, for example, a sputtering method. A part of the touch line metal film TM formed in the opening Op is the cover layer 17b.

Figure 3L:
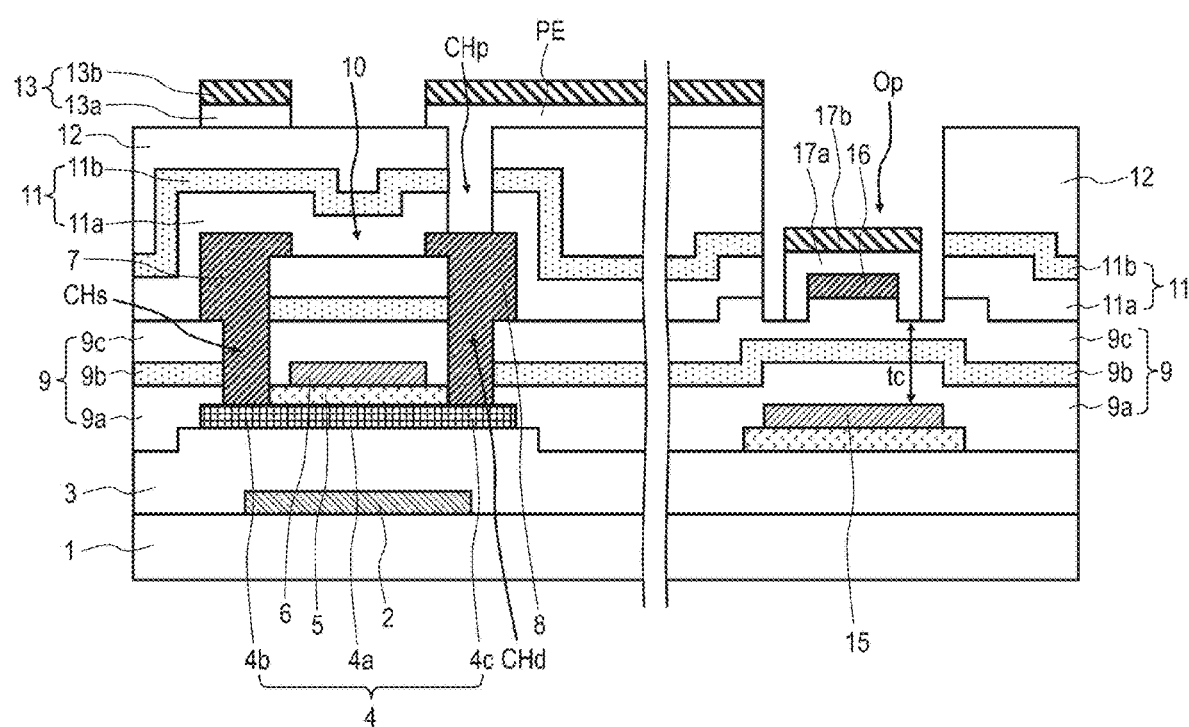
FIG. 3L is a process cross-sectional view illustrating a manufacturing process for the active matrix substrate 100.

Subsequently, as illustrated in FIG. 3L, the pixel electrode PE and the touch line 13 can be obtained by patterning the touch line metal film TM and the first transparent conductive film TC1. The touch line metal film TM and the first transparent conductive film TC1 can be patterned by, for example, wet etching.

Figure 3M:
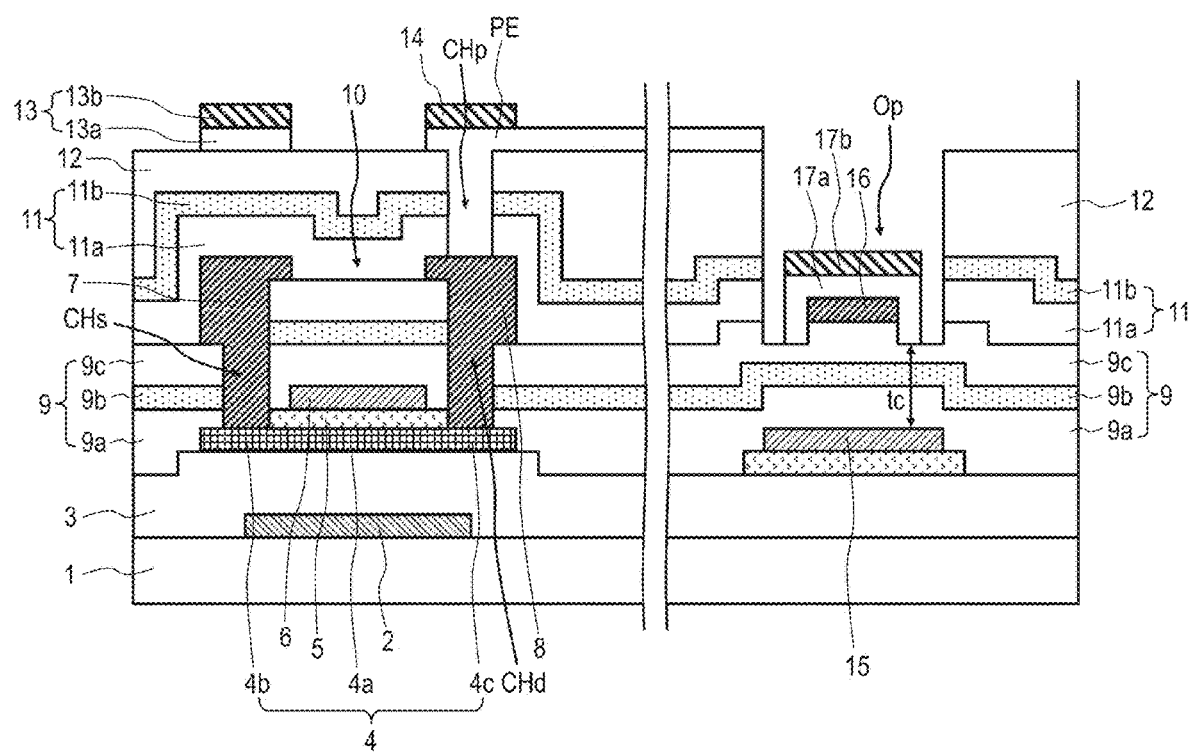
FIG. 3M is a process cross-sectional view illustrating a manufacturing process for the active matrix substrate 100.
Figure 3N:
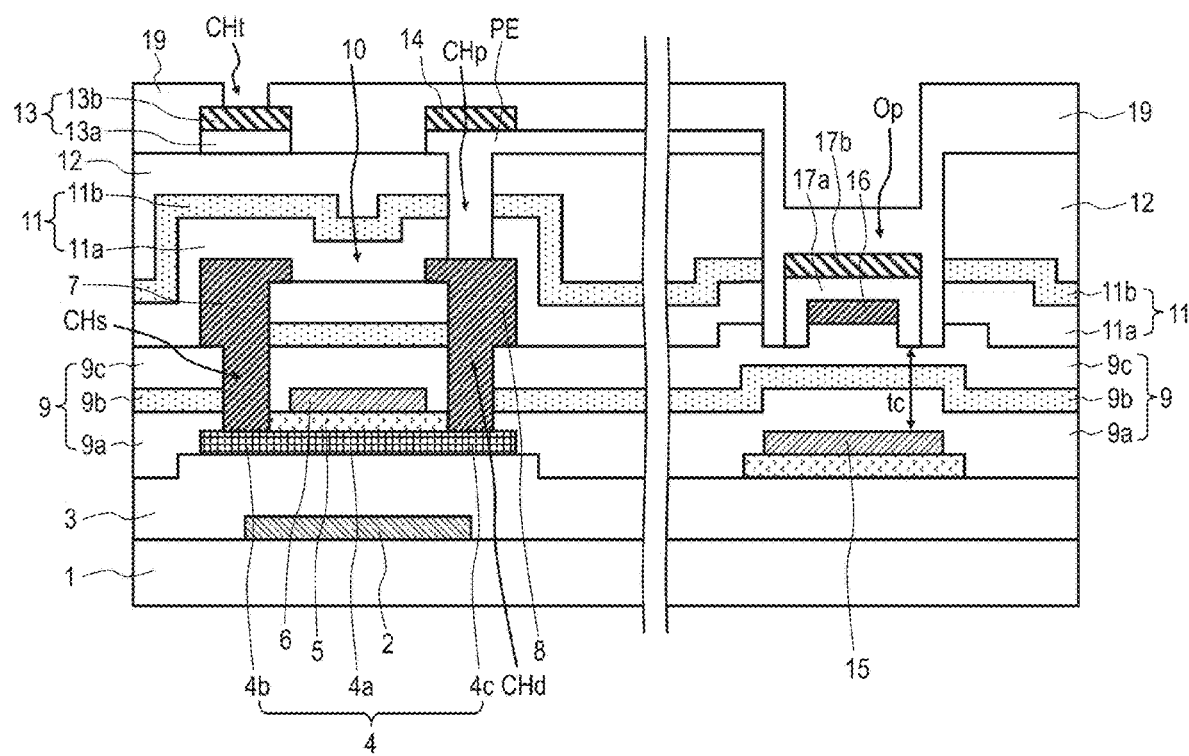
FIG. 3N is a process cross-sectional view illustrating a manufacturing process for the active matrix substrate 100.

Thereafter, as illustrated in FIG. 3M, a part of the touch line metal film TM remaining on the pixel electrode PE other than a part to be the protective electrode layer 14 is removed by a photolithography process.

Next, as illustrated in FIG. 3N, a dielectric layer (having a thickness of, for example, 50 nm or more and 500 nm or less) 19 is formed so as to cover the pixel electrode PE and the like. As a material of the dielectric layer 19, an inorganic insulating material is used. Here, as the dielectric layer 19, for example, a silicon nitride film is formed by CVD. Thereafter, the touch contact hole CHt is formed in the dielectric layer 19 by, for example, dry etching.

Subsequently, the active matrix substrate 100 illustrated in FIG. 2 can be obtained by forming the common electrode CE on the dielectric layer 19, and then forming an alignment film so as to cover the common electrode CE. The common electrode CE can be obtained by forming a second transparent conductive film (having a thickness of, for example, 20 nm or more and 300 nm or less) on the dielectric layer 19, and then patterning the second transparent conductive film. A material of the second transparent conductive film may be the same as the material exemplified as the material of the first transparent conductive film.

In this manner, the active matrix substrate 100 can be obtained.

Figure 4:
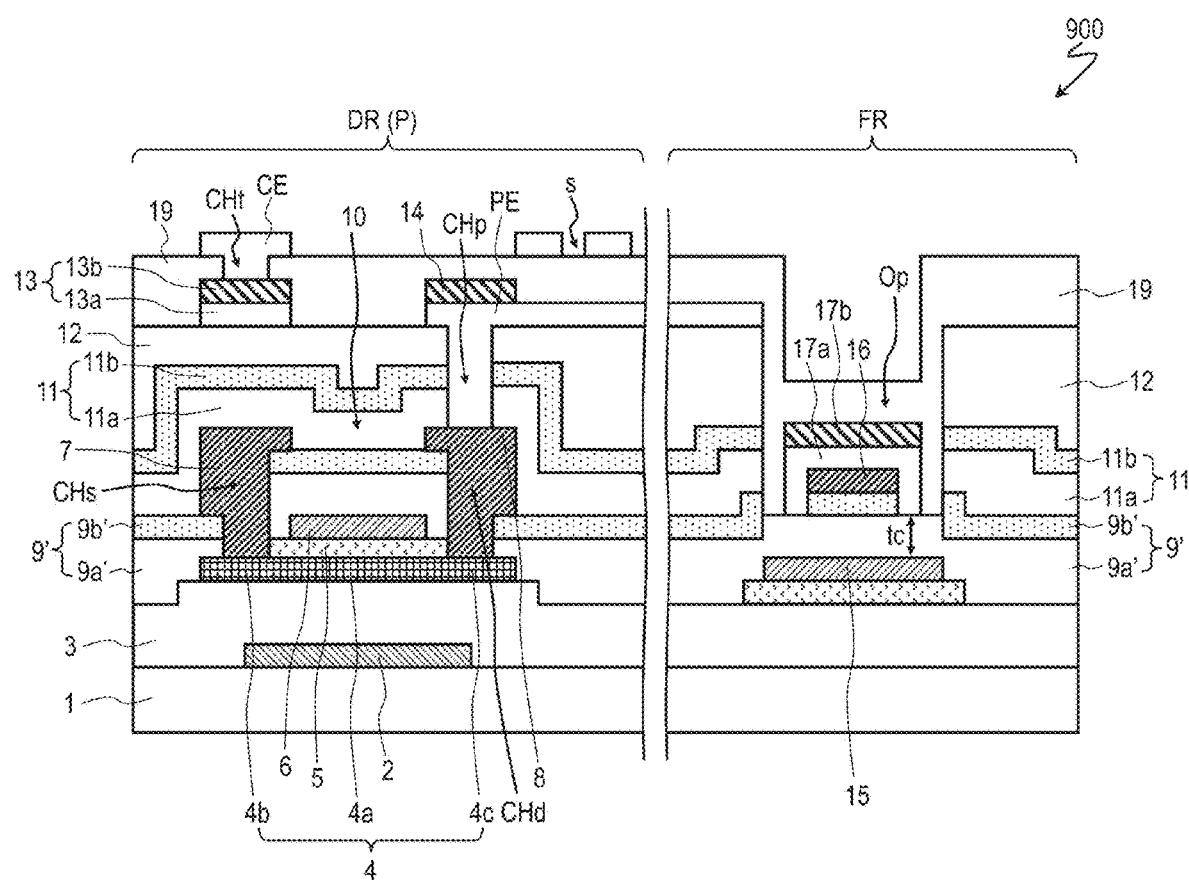
FIG. 4 is a cross-sectional view schematically illustrating an active matrix substrate 900 of a comparative example.

In the active matrix substrate 100 of the present embodiment, the interlayer insulating layer 9 has the layered structure including the lower layer (first layer) 9a formed of silicon oxide, the intermediate layer (second layer) 9b formed of silicon nitride, and the upper layer (third layer) 9c formed of silicon oxide, and thus a decrease in the breakdown voltage between the gate metal layer and the source metal layer in the intersection region (for example, between the lower line 15 and the upper line 16) can be suppressed. Hereinafter, the reason for the above will be described with comparing the active matrix substrate 100 of the present embodiment with an active matrix substrate 900 of a comparative example illustrated in FIG. 4.

In the active matrix substrate 900 of the comparative example, a layered structure of an interlayer insulating layer 9' that covers the gate electrode 6 and the like is different from the layered structure of the interlayer insulating layer 9 in the active matrix substrate 100 of the present embodiment. The interlayer insulating layer 9' of the active matrix substrate 900 of the comparative example has the layered structure including a lower layer 9a' formed of silicon oxide and an upper layer 9b' formed of silicon nitride.

In the active matrix substrate 900 of the comparative example, the upper layer 9b' of the interlayer insulating layer 9' may be removed by overetching in a process of forming a hole in the upper insulating layer 11 using the organic insulating layer 12 as a mask (which is a process of completing the opening Op that overlaps the intersection region of the peripheral region FR and corresponds to the process illustrated in FIG. 3I in the active matrix substrate 100), and thus a thickness of the upper layer 9b' may be thinner. In general, in the dry etching process, since an etching rate of silicon nitride (SiNx) is higher than an etching rate of silicon oxide ($SiO_2$), the removal of the upper layer 9b' by the overetching is likely to proceed, and a thicknesses tc of the interlayer insulating layer 9' in the vicinity of the intersection region is decreased to decrease the breakdown voltage between the lower line 15 and the upper line 16, and thus a leakage current may be generated, so that the yield and reliability may be reduced.

On the other hand, in the active matrix substrate 100 of the present embodiment, the interlayer insulating layer 9 includes the upper layer (third layer) 9c formed of silicon oxide, in addition to the lower layer (first layer) 9a formed of silicon oxide and the intermediate layer (second layer) 9b formed of silicon nitride. Thus, even if the overetching occurs in the process (see FIG. 3I) of forming the fourth hole h4 in the upper insulating layer 11 using the organic insulating layer 12 as the mask, the intermediate layer 9b formed of silicon nitride is not easily removed (that is, the thickness of the intermediate layer 9b is likely to be maintained as it is), and thus the thickness tc of the interlayer insulating layer 9 in the vicinity of the intersection region can be sufficiently secured. Thus, the decrease in the breakdown voltage between the lower line 15 and the upper line 16 is suppressed, and thus the yield and the reliability are improved.

Note that the thickness of each of the lower layer 9a, the intermediate layer 9b, and the upper layer 9c of the interlayer insulating layer 9 is not limited to that exemplified in the above description, but from the viewpoint of more reliably preventing the removal of the intermediate layer 9b by overetching, the thickness of the upper layer 9c is preferably 50 nm or more, and more preferably 100 nm or more.

Second Embodiment

Figure 5:
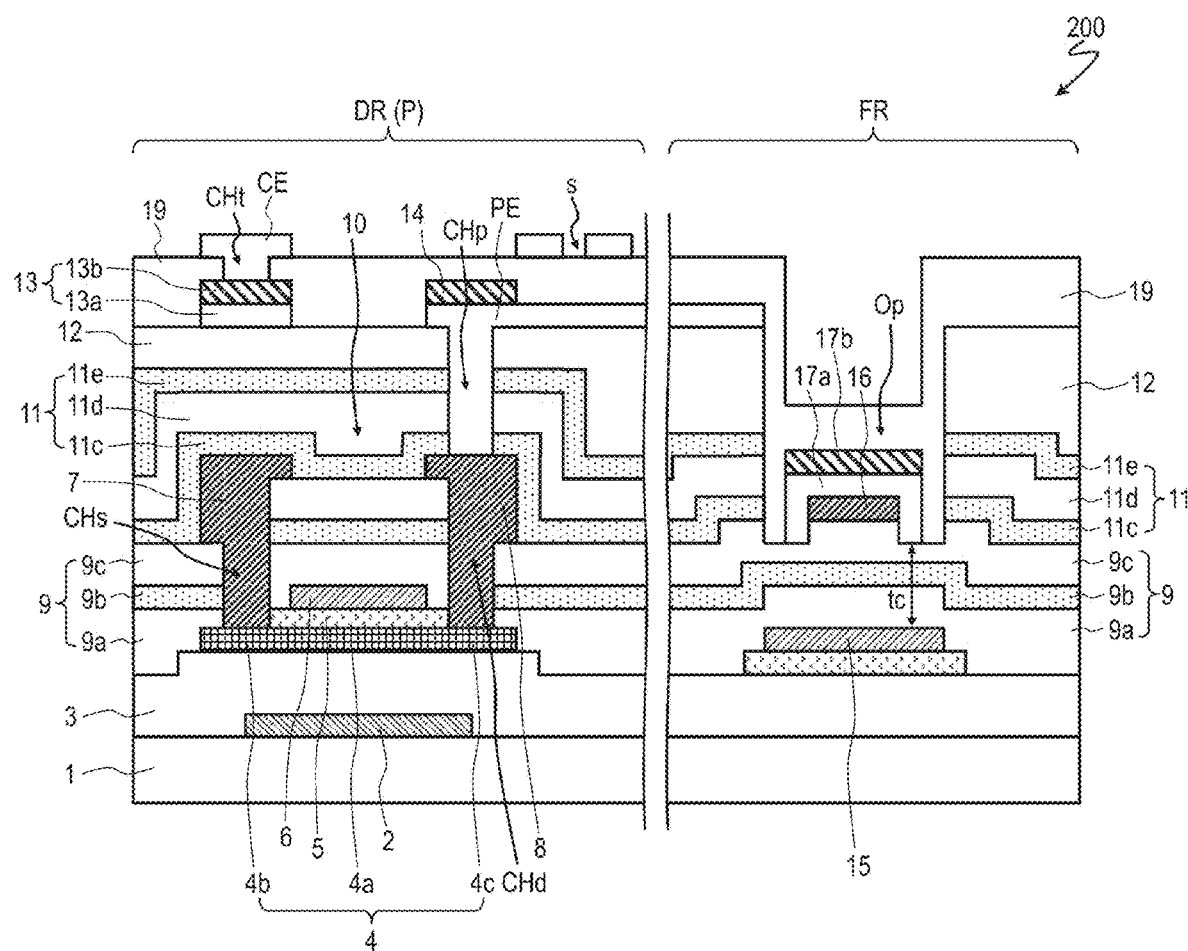
FIG. 5 is a cross-sectional view schematically illustrating another active matrix substrate 200 according to an embodiment of the disclosure.

An active matrix substrate 200 of the present embodiment will be described with reference to FIG. 5. FIG. 5 is a cross-sectional view schematically illustrating the active matrix substrate 200. In the following description, differences between the active matrix substrate 200 and the active matrix substrate 100 according to the first embodiment will be mainly described (the same applies to the following embodiments).

The active matrix substrate 200 of the present embodiment is different from the active matrix substrate 100 according to the first embodiment, in the layered structure of the upper insulating layer 11. The upper insulating layer 11 of the active matrix substrate 200 includes a lower layer (fourth layer) 11c formed of silicon nitride (SiNx), an intermediate layer (fifth layer) 11d provided on the lower layer 11c and formed of silicon oxide ($SiO_2$), and an upper layer (sixth layer) 11e provided on the intermediate layer 11d and formed of silicon nitride (SiNx).

Also in the active matrix substrate 200 of the present embodiment, since the interlayer insulating layer 9 includes the upper layer (third layer) 9c formed of silicon oxide, even if overetching occurs in the process of forming the fourth hole h4 in the upper insulating layer 11 using the organic insulating layer 12 as the mask, the intermediate layer 9b formed of silicon nitride is not easily removed, and thus the thickness tc of the interlayer insulating layer 9 in the vicinity of the intersection region can be sufficiently secured.

In the active matrix substrate 200 of the present embodiment, since the upper insulating layer 11 includes the lower layer 11c formed of silicon nitride, dry etching with respect to the upper insulating layer 11 can be controlled based on an end point detection (EPD) waveform of silicon nitride of the lower layer 11c, so that overetching with respect to the interlayer insulating layer 9 can be made less likely to occur. Thus, the effect of improving the yield and the reliability can be further enhanced.

Third Embodiment

Figure 6:
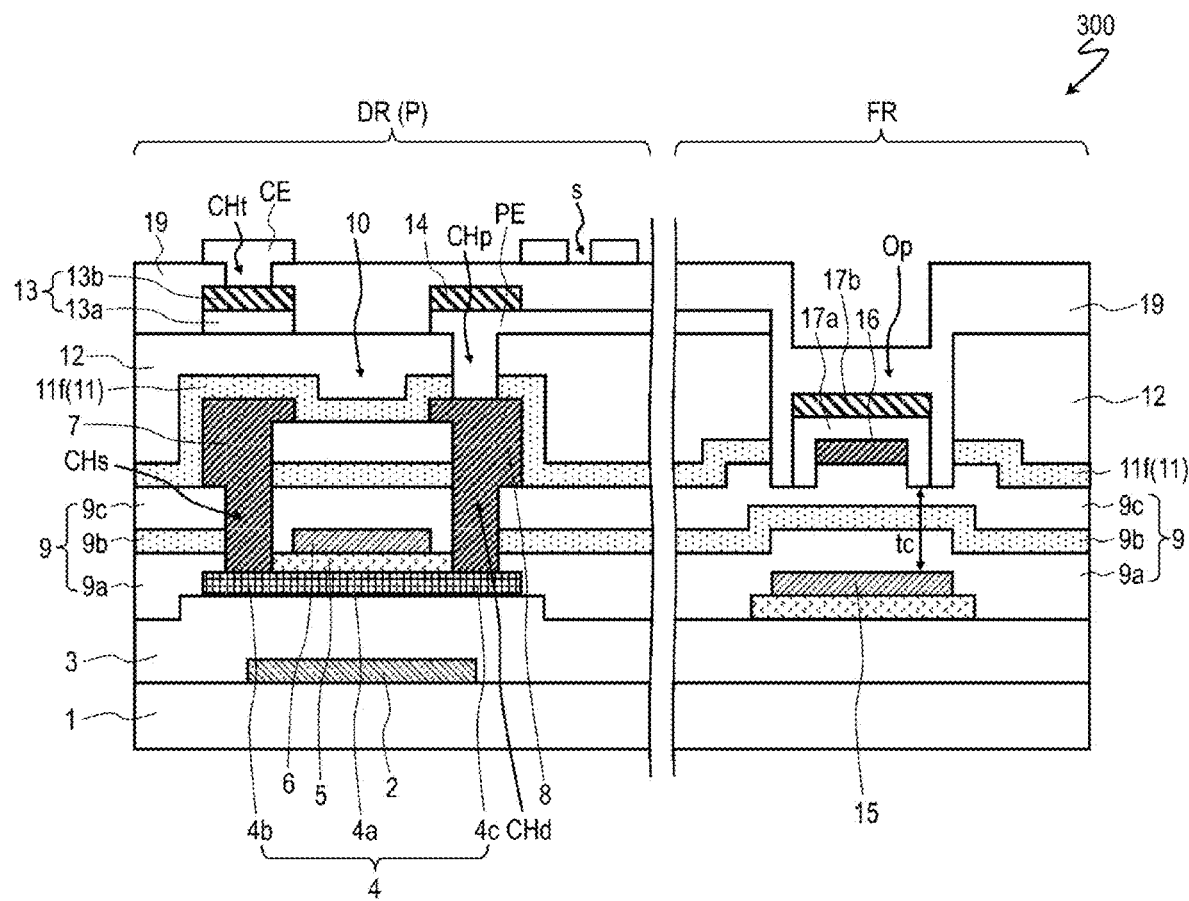
FIG. 6 is a cross-sectional view schematically illustrating yet another active matrix substrate 300 according to an embodiment of the disclosure.

An active matrix substrate 300 of the present embodiment will be described with reference to FIG. 6. FIG. 6 is a cross-sectional view schematically illustrating the active matrix substrate 300.

The active matrix substrate 300 of the present embodiment is different from the active matrix substrate 100 according to the first embodiment in a configuration of the upper insulating layer 11. The upper insulating layer 11 of the active matrix substrate 300 includes only an insulating layer (fourth layer) 11f formed of silicon nitride (SiNx) (that is, a single-layer).

Also in the active matrix substrate 300 of the present embodiment, since the interlayer insulating layer 9 includes the upper layer (third layer) 9c formed of silicon oxide, even if overetching occurs in the process of forming the fourth hole h4 in the upper insulating layer 11 using the organic insulating layer 12 as the mask, the intermediate layer 9b formed of silicon nitride is not easily removed, and thus the thickness tc of the interlayer insulating layer 9 in the vicinity of the intersection region can be sufficiently secured.

In the active matrix substrate 300 of the present embodiment, since the upper insulating layer 11 includes a single layer, that is, the insulating layer 11f formed of silicon nitride, dry etching with respect to the upper insulating layer 11 can be controlled based on the end point detection (EPD) waveform of silicon nitride of the insulating layer 11f, so that overetching with respect to the interlayer insulating layer 9 can be made less likely to occur. Thus, the effect of improving the yield and the reliability can be further enhanced.

In the above description, the case has been exemplified in which the opening Op included in the organic insulating layer 12 and the upper insulating layer 11 is located in the gate line drive circuit GD, but the opening Op of the organic insulating layer 12 and the upper insulating layer 11 may be formed at another position. For example, in a case where the SSD circuit is monolithically formed on the substrate 1, the opening Op of the organic insulating layer 12 and the upper insulating layer 11 may be formed so as to overlap the intersection region (region where the gate metal layer and the source metal layer overlap each other with the interlayer insulating layer 9 interposed therebetween) in the SSD circuit.

Figure 7:
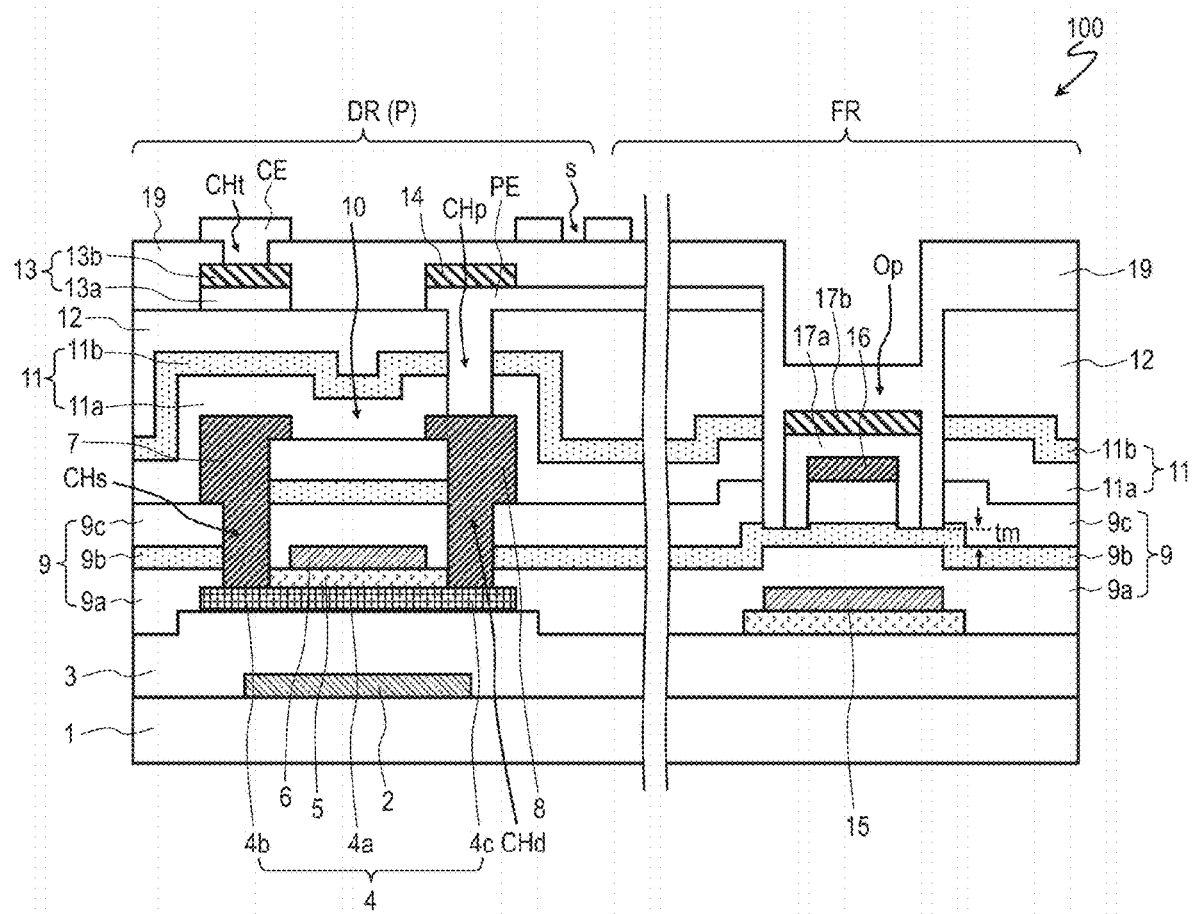
FIG. 7 is a cross-sectional view schematically illustrating the active matrix substrate 100.

In the above description, the configuration has been exemplified in which the interlayer insulating layer 9 includes the first layer 9a, the second layer 9b, and the third layer 9c in the entirety of the region overlapping the opening Op, that is, the configuration in which the upper layer (third layer) 9c remains even after the overetching is performed. On the other hand, as illustrated in FIG. 7, the interlayer insulating layer 9 may include a portion that includes the first layer 9a and the second layer 9b and does not include the third layer 9c in the region overlapping the opening Op. That is, a portion where the upper layer (third layer) 9c is removed by the overetching may be present. In this case, a thickness tm of the intermediate layer (second layer) 9c included in the portion where the upper layer 9b is removed is preferably 50 nm or more from the viewpoint of sufficiently obtaining the effect of improving the yield and the reliability.

In the above description, the active matrix substrate used in the in-cell touch panel liquid crystal display device performing display in the FFS mode has been exemplified, but the active matrix substrate according to the embodiment of the disclosure is also suitably used in a liquid crystal display device performing display in a display mode other than the FFS mode, and is also suitably used in a liquid crystal display device other than the in-cell touch panel liquid crystal display device.

Display Device

Figure 8:
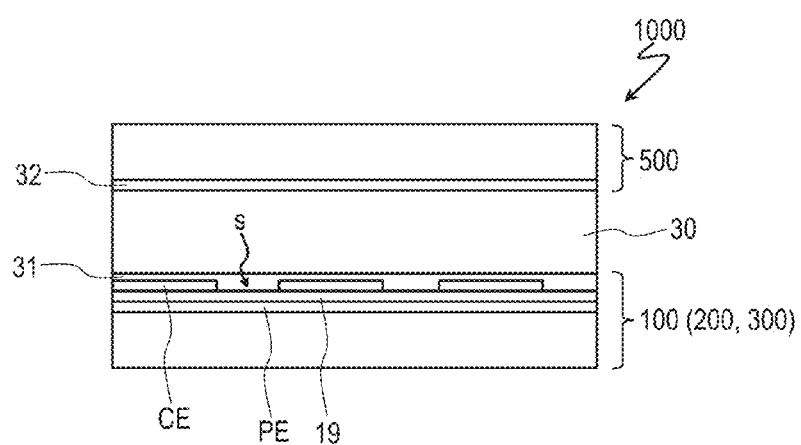
FIG. 8 is a cross-sectional view schematically illustrating a liquid crystal display device 1000 including the active matrix substrate 100, 200, and 300.

The active matrix substrates 100, 200, and 300 according to the embodiments of the disclosure can be suitably used, for example, in a liquid crystal display device. FIG. 8 illustrates an example of the liquid crystal display device.

A liquid crystal display device 1000 illustrated in FIG. 8 includes the active matrix substrate 100 (or the active matrix substrate 200 or 300), a counter substrate 500 provided so as to face the active matrix substrate 100, and a liquid crystal layer 30 provided between the active matrix substrate 100 and the counter substrate 500.

The active matrix substrate 100 includes the pixel TFT 10 (not illustrated here) disposed in each pixel region P, the pixel electrode PE electrically connected to the pixel TFT 10, the dielectric layer 19 provided so as to cover the pixel electrodes PE, and the common electrode CE provided on the dielectric layer 19 and facing the pixel electrodes PE. At least one slit s is formed in the common electrode CE for each pixel region P.

Each of alignment films 31 and 32 is provided on the outermost surface on the liquid crystal layer 30 side of a respective one of the active matrix substrate 100 and the counter substrate 500. The counter substrate 500 typically includes a color filter layer (not illustrated). A thickness (cell gap) of the liquid crystal layer 30 is defined by a columnar spacer (not illustrated) provided on the liquid crystal layer 30 side of the counter substrate 500.

The active matrix substrate according to the embodiment of the disclosure may be used for a display device (for example, an organic EL display device) other than the liquid crystal display device.

Oxide Semiconductor

An oxide semiconductor included in the oxide semiconductor layer 4 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer 4 may have a layered structure including two or more layers. The oxide semiconductor layer 4 having a layered structure may include an amorphous oxide semiconductor layer and a crystalline oxide semiconductor layer, and may include a plurality of crystalline oxide semiconductor layers having different crystal structures. In addition, the oxide semiconductor layer 4 having a layered structure may include a plurality of amorphous oxide semiconductor layers. In a case where the oxide semiconductor layer 4 has a dual-layer structure including an upper layer and a lower layer, an energy gap of the oxide semiconductor included in the lower layer is preferably greater than an energy gap of the oxide semiconductor included in the upper layer. However, when the difference in energy gap between these layers is relatively small, the energy gap of the oxide semiconductor in the upper layer may be greater than the energy gap of the oxide semiconductor in the lower layer.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer 4 may include, for example, at least one metal element among In, Ga, and Zn. In the present embodiment, the oxide semiconductor layer 11 includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. Such an oxide semiconductor layer 11 can be formed of an oxide semiconductor film including the In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than $\frac{1}{100}$ as compared to the a-Si TFT). Thus, such a TFT can be suitably used as a drive TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 4 may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer 11 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, and an In—Ga—Zn—Sn—O based semiconductor.

INDUSTRIAL APPLICABILITY

According to an embodiment of the disclosure, yield and reliability of an active matrix substrate including the oxide semiconductor TFT having the top gate structure can be improved. The active matrix substrate according to the embodiment of the disclosure is suitably used for various display devices such as a liquid crystal display device, an organic EL display device, or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a plurality of pixel regions arranged in a matrix;
a substrate;
a thin film transistor (TFT) supported by the substrate and provided corresponding to each of the plurality of pixel regions, the TFT including an oxide semiconductor layer, a gate insulating layer provided on the oxide semiconductor layer, and a gate electrode facing the oxide semiconductor layer with the gate insulating layer interposed therebetween;
a plurality of gate lines extending in a row direction and formed of the same conductive film as the gate electrode;
an interlayer insulating layer covering the gate electrode and the plurality of gate lines;
a plurality of source lines extending in a column direction and provided on the interlayer insulating layer;
an upper insulating layer covering the plurality of source lines;
an organic insulating layer provided on the upper insulating layer;
a display region and a peripheral region located around the display region;
a gate metal layer including the gate electrode and the plurality of gate lines; and
a source metal layer including the plurality of source lines; wherein
the interlayer insulating layer includes:
a first layer formed of silicon oxide,
a second layer provided on the first layer and formed of silicon nitride, and
a third layer provided on the second layer and formed of silicon oxide;
the organic insulating layer and the upper insulating layer include an opening provided to extend through both the organic insulating layer and the upper insulating layer; and
the opening overlaps, in the peripheral region, an intersection region in which the gate metal layer and the source metal layer overlap each other with the interlayer insulating layer interposed therebetween.

2. The active matrix substrate according to claim 1, wherein a thickness of the third layer of the interlayer insulating layer is 50 nm or more.

3. The active matrix substrate according to claim 1, wherein the upper insulating layer includes
a fourth layer formed of silicon oxide, and
a fifth layer provided on the fourth layer and formed of silicon nitride.

4. The active matrix substrate according to claim 1, wherein the upper insulating layer includes
a fourth layer formed of silicon nitride,
a fifth layer provided on the fourth layer and formed of silicon oxide, and
a sixth layer provided on the fifth layer and formed of silicon nitride.

5. The active matrix substrate according to claim 1, wherein the upper insulating layer includes only a fourth layer formed of silicon nitride.

6. The active matrix substrate according to claim 1, wherein the interlayer insulating layer includes a portion including the first layer and the second layer and not including the third layer in a region overlapping the opening.

7. The active matrix substrate according to claim 6, wherein a thickness of the second layer included in the portion of the interlayer insulating layer is 50 nm or more.

8. The active matrix substrate according to claim 1, wherein the interlayer insulating layer includes the first layer, the second layer, and the third layer in the entirety of the region overlapping the opening.

9. The active matrix substrate according to claim 1, further comprising:
a gate line drive circuit configured to drive the plurality of gate lines, the gate line drive circuit being monolithically formed on the substrate,
wherein the opening included in the organic insulating layer and the upper insulating layer is located in the gate line drive circuit.

10. The active matrix substrate according to claim 1, wherein the oxide semiconductor layer includes an In—Ga—Zn—O based semiconductor.

11. The active matrix substrate according to claim 10, wherein the In—Ga—Zn—O based semiconductor includes a crystalline portion.

12. A display device comprising:
the active matrix substrate according to claim 1.

13. The display device according to claim 12,
wherein the display device is a liquid crystal display device including
a counter substrate facing the active matrix substrate, and
a liquid crystal layer provided between the active matrix substrate and the counter substrate.

14. The active matrix substrate according to claim 1, further comprising:
a dielectric layer covering the organic insulating layer; wherein
an entire side surface of the opening is in contact with the dielectric layer.

* * * * *